(12) United States Patent
Lin et al.

(10) Patent No.: US 11,769,837 B2
(45) Date of Patent: *Sep. 26, 2023

(54) SEMICONDUCTOR DEVICE

(71) Applicant: Taiwan Semiconductor Manufacturing Company, Ltd., Hsinchu (TW)

(72) Inventors: Yu-Chu Lin, Tainan (TW); Chi-Chung Jen, Kaohsiung (TW); Wen-Chih Chiang, Hsinchu (TW); Ming-Hong Su, Tainan (TW); Yung-Han Chen, Taichung (TW); Mei-Chen Su, Kaohsiung (TW); Chia-Ming Pan, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/586,898

(22) Filed: Jan. 28, 2022

(65) Prior Publication Data

US 2022/0165877 A1 May 26, 2022

Related U.S. Application Data

(63) Continuation of application No. 17/100,562, filed on Nov. 20, 2020, now Pat. No. 11,257,963.

(51) Int. Cl.
*H01L 29/78* (2006.01)
*G11C 16/14* (2006.01)
(Continued)

(52) U.S. Cl.
CPC ............ *H01L 29/788* (2013.01); *G11C 16/14* (2013.01); *H01L 29/66825* (2013.01); *H10B 41/10* (2023.02); *H10B 41/35* (2023.02)

(58) Field of Classification Search
None
See application file for complete search history.

(56) References Cited

U.S. PATENT DOCUMENTS 6,221,716 B1   4/2001  Lee et al.
6,524,909 B1 *  2/2003  Wang ................ H01L 29/40114
                                                    438/257

(Continued)

OTHER PUBLICATIONS

Co-pending U.S. Appl. No. 17/100,562, inventor Lin; Yu-Chu, filed Nov. 20, 2020.

*Primary Examiner* — Tan T. Nguyen
(74) *Attorney, Agent, or Firm* — Harrity & Harrity, LLP

(57) ABSTRACT

In some implementations, one or more semiconductor processing tools may form a first terminal of a semiconductor device by depositing a tunneling oxide layer on a first portion of a body of the semiconductor device, depositing a first volume of polysilicon-based material on the tunneling oxide layer, and depositing a first dielectric layer on an upper surface and a second dielectric layer on a side surface of the first volume of polysilicon-based material. The one or more semiconductor processing tools may form a second terminal of the semiconductor device by depositing a second volume of polysilicon-based material on a second portion of the body of the semiconductor device. A side surface of the second volume of polysilicon-based material is adjacent to the second dielectric layer.

20 Claims, 7 Drawing Sheets

(51) Int. Cl.
*H01L 29/788* (2006.01)
*H01L 29/66* (2006.01)
*H10B 41/10* (2023.01)
*H10B 41/35* (2023.01)

(56) References Cited

U.S. PATENT DOCUMENTS

| | | | | |
|---|---|---|---|---|
| 7,091,551 B1 * | 8/2006 | Anderson | ............ | H01L 29/7887 |
| | | | | 257/E27.103 |
| 11,257,963 B1 * | 2/2022 | Lin | ................... | H01L 29/42324 |
| 2006/0151827 A1 | 7/2006 | Kumazaki | | |
| 2007/0001216 A1 | 1/2007 | Lee | | |
| 2010/0163961 A1 | 7/2010 | Kim | | |
| 2012/0211818 A1 * | 8/2012 | Lee | ................... | H01L 29/40114 |
| | | | | 257/E27.081 |

* cited by examiner

SEMICONDUCTOR DEVICE

RELATED APPLICATION

This application is a continuation of U.S. patent application Ser. No. 17/100,562, filed Nov. 20, 2020, which is incorporated herein by reference in its entirety.

BACKGROUND

A transistor is a common type of semiconductor device in electronic devices that is able to amplify and/or switch electrical signals. A transistor may be configured with three terminals to receive one or more applications of voltage. A voltage applied to a first terminal associated with a gate may control a current across a second terminal associated with a source voltage and a third terminal associated with a drain voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
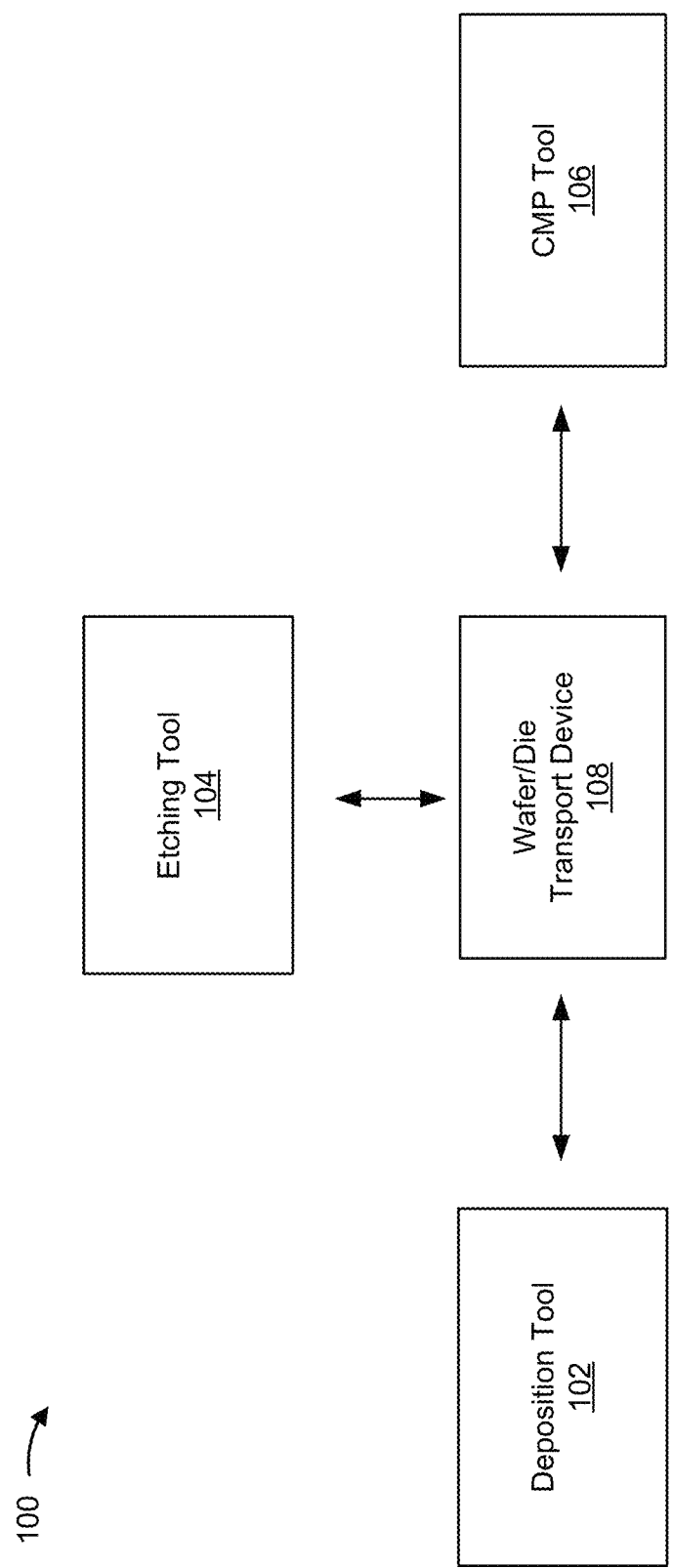
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Application of a first voltage to a first terminal of a transistor to configure the transistor in a first state may be defined as a programming operation (e.g., to control the current) and application of a second voltage to the first terminal may be defined as an erasing operation (e.g., to return the transistor to a null state). The programming operation and the erasing operation may include applications of the first voltage and the second voltage, respectively, across a tunnel oxide layer of the first terminal and into an active area of the transistor.

In some cases, cycling between the programming operation and the erasing operation may deteriorate a tunneling oxide layer of a transistor. In an example transistor, application of a relatively high voltage (e.g., approximately 8.7 volts) on a first terminal (e.g., a gate terminal), a moderate voltage (e.g., 4 volts) on a second terminal (e.g., a source and/or drain terminal), and a relatively low voltage (e.g., approximately 0 volts) on a third terminal (e.g., a drain and/or source terminal) may program the transistor. Additionally, or alternatively, application of a relatively low voltage (e.g., approximately −16 volts) on the first terminal, a relatively high voltage (e.g., 0 volts) on the second terminal, and a relatively high voltage (e.g., approximately 0 volts) on the third terminal may erase the transistor (e.g., erase the programming).

The programming operation and the erasing operation are implemented based on a voltage being applied across the tunneling oxide layer, which separates a gate (e.g., a control gate) of the first terminal from a body of the transistor. This may cause deterioration of the tunneling oxide layer.

Some implementations described herein provide a semiconductor device (e.g., a transistor) and techniques and apparatuses for manufacturing the semiconductor device, as described herein. In some implementations, the semiconductor device may include a first terminal (e.g., a floating gate terminal) that is coupled to a body of the semiconductor device. The first terminal may include a tunneling oxide layer formed on a body of the semiconductor device, a first gate (e.g., a floating gate and/or a first volume of polysilicon-based material, among other examples) formed on the tunneling oxide layer, and a first dielectric layer formed on (e.g., on an upper surface of) the first gate. The semiconductor device may also include a second terminal that is coupled to the body of the semiconductor device. The second terminal may include a second gate (e.g., a control gate and/or a second volume of polysilicon-based material, among other examples) formed on the body of the semiconductor device. The semiconductor device may further include a second dielectric layer formed between the first gate and the second gate. In some implementations, the first gate and the second gate may be formed on opposite sides of the second dielectric layer.

Application of a relatively high voltage (e.g., approximately 8.7 volts) on a first terminal (e.g., a gate terminal), a moderate voltage (e.g., 4 volts) on a second terminal (e.g., a source and/or drain terminal), and a relatively low voltage (e.g., approximately −2 microvolts or approximately 0 volts) on a third terminal (e.g., a drain and/or source terminal) may program the semiconductor device. Additionally, or alternatively, application of a relatively low voltage (e.g., approximately 0 volts) on the first terminal, a relatively high voltage (e.g., 10.5 volts) on the second terminal, and a relatively low voltage (e.g., approximately 0 volts) on the third terminal may erase the semiconductor device (e.g., erase the programming).

The programming operation of the semiconductor device may be implemented based on a voltage difference across the tunneling oxide layer and the erasing operation may be implemented based on a voltage difference across the second dielectric layer, instead of the tunneling oxide layer. This may reduce stress on the tunneling oxide layer and/or reduce deterioration during a programming and erasing cycle of the tunneling oxide layer, which may increase a life of the semiconductor device.

FIG. 1 is a diagram of an example environment 100 in which systems and/or methods described herein may be implemented. As shown in FIG. 1, environment 100 may include a plurality of semiconductor processing tools 102-106 and a wafer/die transport device 108. The plurality of semiconductor processing tools 102-106 may include a deposition tool 102, an etching tool 104, and/or a chemical-mechanical polishing (CMP) tool 106, among other examples. The semiconductor processing tools included in example environment 100 may be included in a semiconductor clean room, a semiconductor foundry, and/or a semiconductor processing and/or manufacturing facility, among other examples.

Deposition tool 102 is a semiconductor processing tool that includes a semiconductor processing chamber and one or more devices capable of depositing various types of materials onto a semiconductor device. For example, deposition tool 102 may include a chemical vapor deposition device (e.g., an electrostatic spray device, an epitaxy device, and/or another type of chemical vapor deposition device), a physical vapor deposition device (e.g., a metal deposition device, a sputtering device, and/or another type of physical vapor deposition device), and/or an atomic layer deposition device, among other examples. In some implementations, deposition tool 102 may deposit a material onto a semiconductor device, among other examples, as described herein.

Etching tool 104 is a semiconductor processing tool that includes one or more devices capable of etching (e.g., removing) material from a surface of a wafer or a semiconductor device. For example, etching tool 104 may include a wet etching device, a dry etching device, a laser etching device, a chemical etching device, a plasma etching device, a reactive ion etching device, a sputter etching device, and/or a vapor phase etching device, among other examples. In some implementations, etching tool 104 may remove a layer from a semiconductor device as described herein.

CMP tool 106 is a semiconductor processing tool that includes one or more device capable of polishing or planarizing various layers of a wafer or semiconductor device. In some implementations, CMP tool 106 may polish or planarize a layer of deposited or plated material.

Wafer/die transport device 108 includes a mobile robot, a robot arm, a tram or rail car, and/or another type of device that are used to transport wafers and/or dies between semiconductor processing tools 102-106 and/or to and from other locations such as a wafer rack, and/or a storage room, among other examples. In some implementations, wafer/die transport device 108 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

FIGS. 2A-2E are diagrams of one or more example implementations described herein. Example implementation(s) may include one or more example implementations of a process for manufacturing a semiconductor device 200 (e.g., a transistor), as described herein. In some implementations, example implementation(s) may include a process of forming a first terminal that includes a first gate (e.g., a floating gate) and forming a second terminal that includes a second gate (e.g., a control gate), with a dielectric layer formed between the first gate and the second gate. The first terminal may include a tunneling oxide layer between the first gate and a body of the semiconductor device 200 and/or may include an additional dielectric layer between the first gate and a conductor material of the first terminal. Based on the second terminal including the second gate that is separated from the first gate by the dielectric layer, the semiconductor device may perform an erasing operation that is based on a voltage difference across the dielectric layer. This may reduce deterioration of the tunneling oxide.

FIGS. 2A-2E show top views (left), X-axis cross-section views (top right), and Y-axis cross-section views (bottom right). FIGS. 2A-2E show a process for manufacturing multiple (e.g., 4) semiconductor devices in a batch.

Figure 2A:
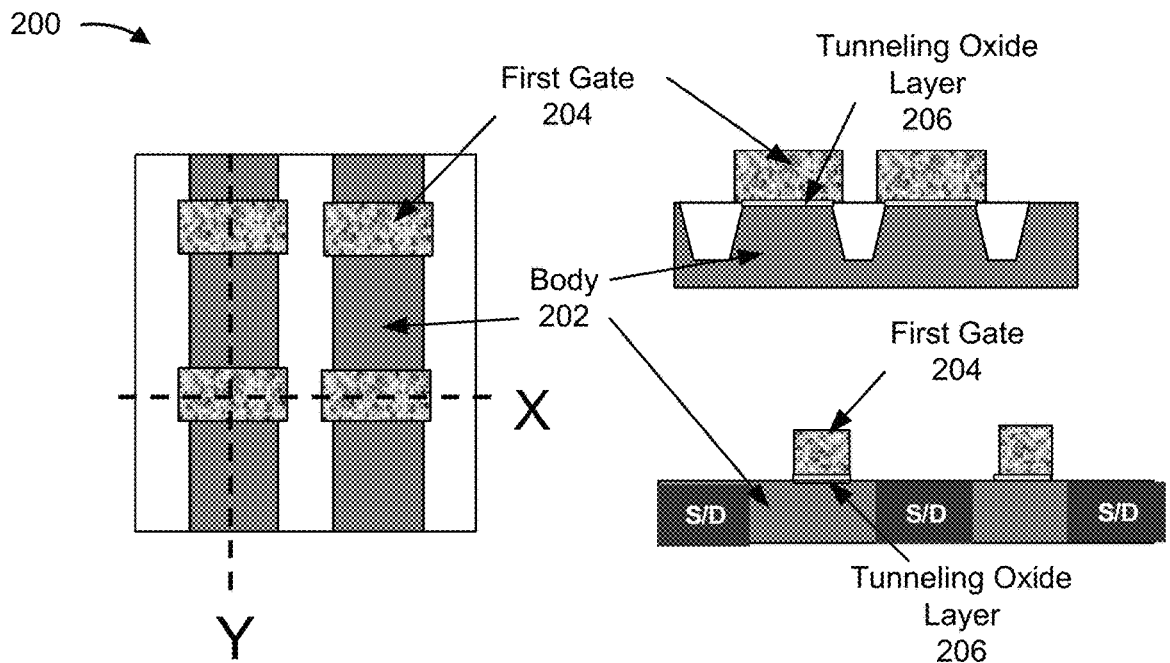
FIGS. 2A-2E are diagrams illustrating a sequence of operations for manufacturing a semiconductor device, as described herein.

As shown in FIG. 2A, the semiconductor device 200 (e.g., a transistor) may include a body 202 (e.g., a substrate), a first gate 204, and a tunneling oxide layer 206. Each semiconductor device 200 may have a respective first gate 204 and a respective tunneling oxide layer 206.

In some implementations, a deposition tool (e.g., deposition tool 102) may deposit the tunneling oxide layer 206 onto a first portion of the body 202 of the semiconductor device 200. In some implementations, the deposition tool may use chemical vapor deposition or physical vapor deposition, among other examples, to deposit the tunneling oxide layer 206 onto the first portion of the body 202 of the semiconductor device 200. In some implementations, an etching tool (e.g., etching tool 104) may etch (e.g., remove) a portion of oxide material (e.g., after depositing oxide material onto the body 202 of the semiconductor device 200) to form the tunneling oxide layer 206 on the first portion of the body 202 of the semiconductor device 200. In some implementations, a CMP tool (e.g., CMP tool 106) may planarize an upper surface of the tunneling oxide layer 206.

In some implementations, a deposition tool (e.g., deposition tool 102) may deposit the first gate 204 on the tunneling oxide layer 206. In some implementations, the deposition tool may use chemical vapor deposition or physical vapor deposition, among other examples, to deposit material for the first gate 204 (e.g., a volume of polysilicon-based material) onto the tunneling oxide layer 206 and/or a portion of the body 202 of the semiconductor device 200. In some implementations, an etching tool (e.g., etching tool 104) may etch a portion of the material for the first gate 204 (e.g., after depositing the material for the first gate 204) to form the first gate 204. In some implementations, a CMP tool (e.g., CMP tool 106) may planarize an upper surface of the first gate 204.

Figure 2B:
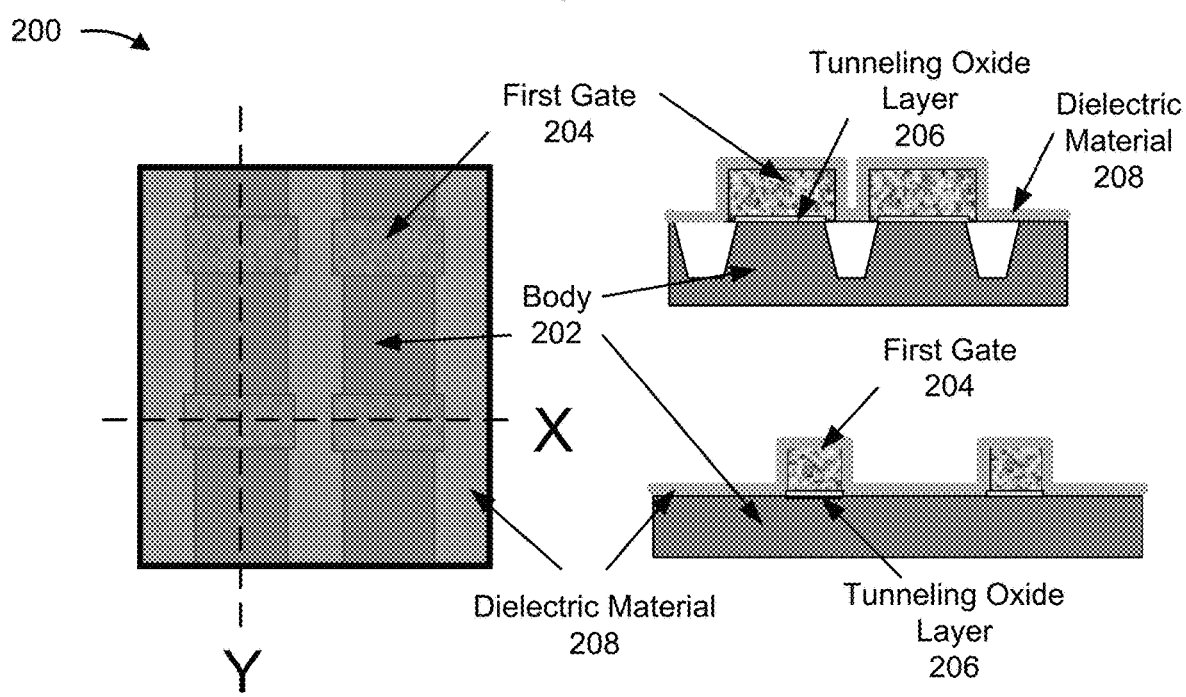

As shown in FIG. 2B, a deposition tool (e.g., deposition tool 102) may deposit a dielectric material 208 on the first gate 104 and/or the body 202 of the semiconductor device 200. In some implementations, the deposition tool may use chemical vapor deposition or physical vapor deposition, among other examples, to deposit the dielectric material 208 onto the first gate 204 and/or a portion of the body 202 of the semiconductor device 200. In some implementations, the deposition tool may form the dielectric material 208 based on depositing a first oxide-based film on at least the upper surface of the first gate 204 and a side surface of the first gate 204, depositing a nitride-based (e.g., silicon nitride-based) film on the first oxide-based film, and depositing a second oxide-based film on the nitride-based film to form an oxide-silicon nitride-oxide sandwich structure.

Figure 2C:
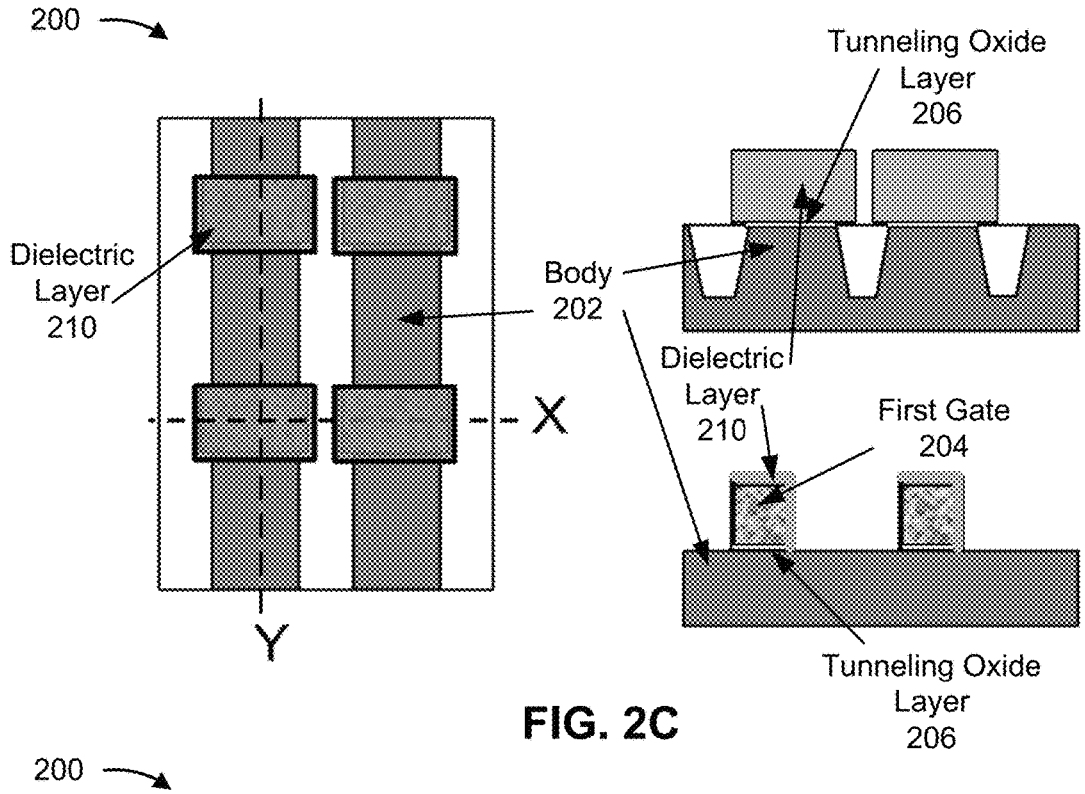

As shown in FIG. 2C, an etching tool (e.g., etching tool 104) may etch a portion of the dielectric material 208 to form a dielectric layer 210 on the first gate 204. The dielectric layer 210 may have a first portion on an upper surface of the first gate 204 and a second portion on a side surface of the first gate 204. In some implementations, a CMP tool (e.g., CMP tool 106) may planarize an upper surface of the dielectric layer 210.

Figure 2D:
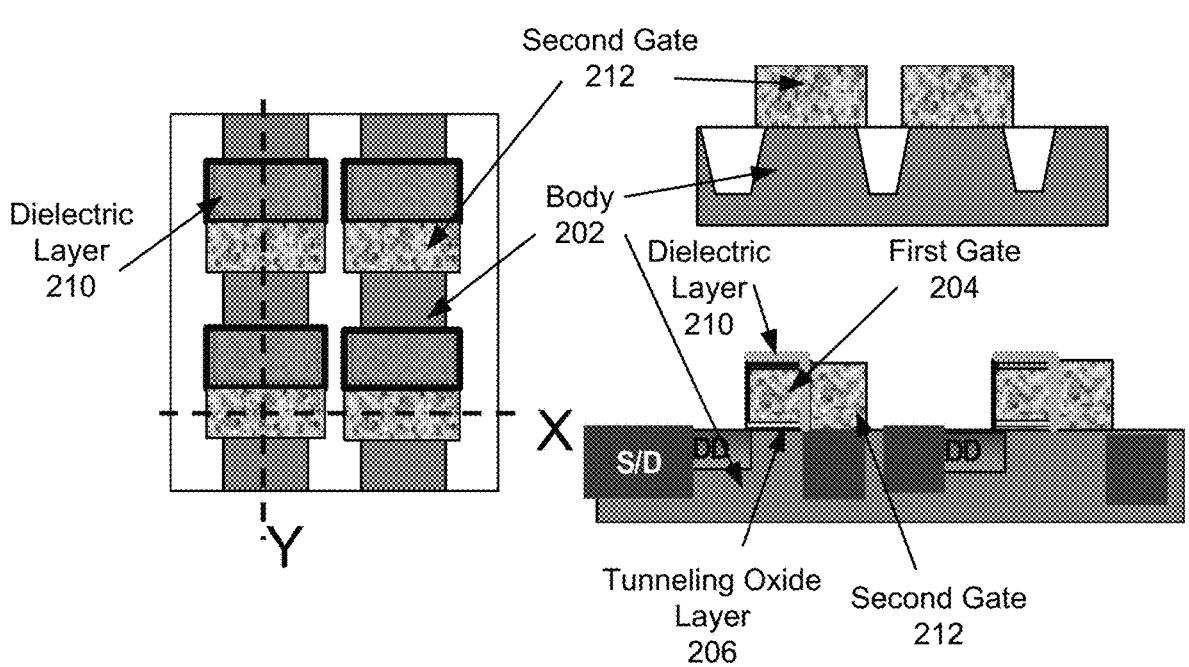

As shown in FIG. 2D, a deposition tool (e.g., deposition tool 102) may deposit a second gate 212 on a second portion of the body 202 of the semiconductor device 200. The deposition tool may deposit the second gate 212 so that a side surface of the second gate 212 is adjacent to the second portion of the dielectric layer 210 that is on the side surface of the first gate 204. In some implementations, the deposition tool may use chemical vapor deposition or physical vapor deposition, among other examples, to deposit material for the second gate 212 (e.g., a volume of polysilicon-based material) onto the dielectric layer 210 and/or a portion of the body 202 of the semiconductor device 200. In some implementations, an etching tool (e.g., etching tool 104) may etch a portion material for the second gate 212 (e.g., after depositing the material for the first gate 204) to form the second gate 212. In some implementations, a CMP tool (e.g., CMP tool 106) may planarize an upper surface of the second gate 212.

In some implementations (e.g., as will be described in connection with FIG. 3), a deposition tool (e.g., deposition tool 102) may deposit a first sidewall on an additional side surface, of the first gate 204, that is opposite the side surface of the first gate 204. In some implementations (e.g., as will be described in connection with FIG. 3), a deposition tool (e.g., deposition tool 102) may also deposit a second sidewall on an additional side surface, of the second gate 212, that is opposite the side surface of the second gate 212. In other words, the deposition tool may deposit sidewalls on opposite sides of a combined structure that includes the first gate 204, the second gate 212, and the second portion of the dielectric layer 210. In some implementations, the first sidewall and the second sidewall may comprise an oxide-based material and/or a nitride-based material. In some implementations, the first sidewall and the second sidewall may provide structural support and/or electrical insulation.

Figure 2E:
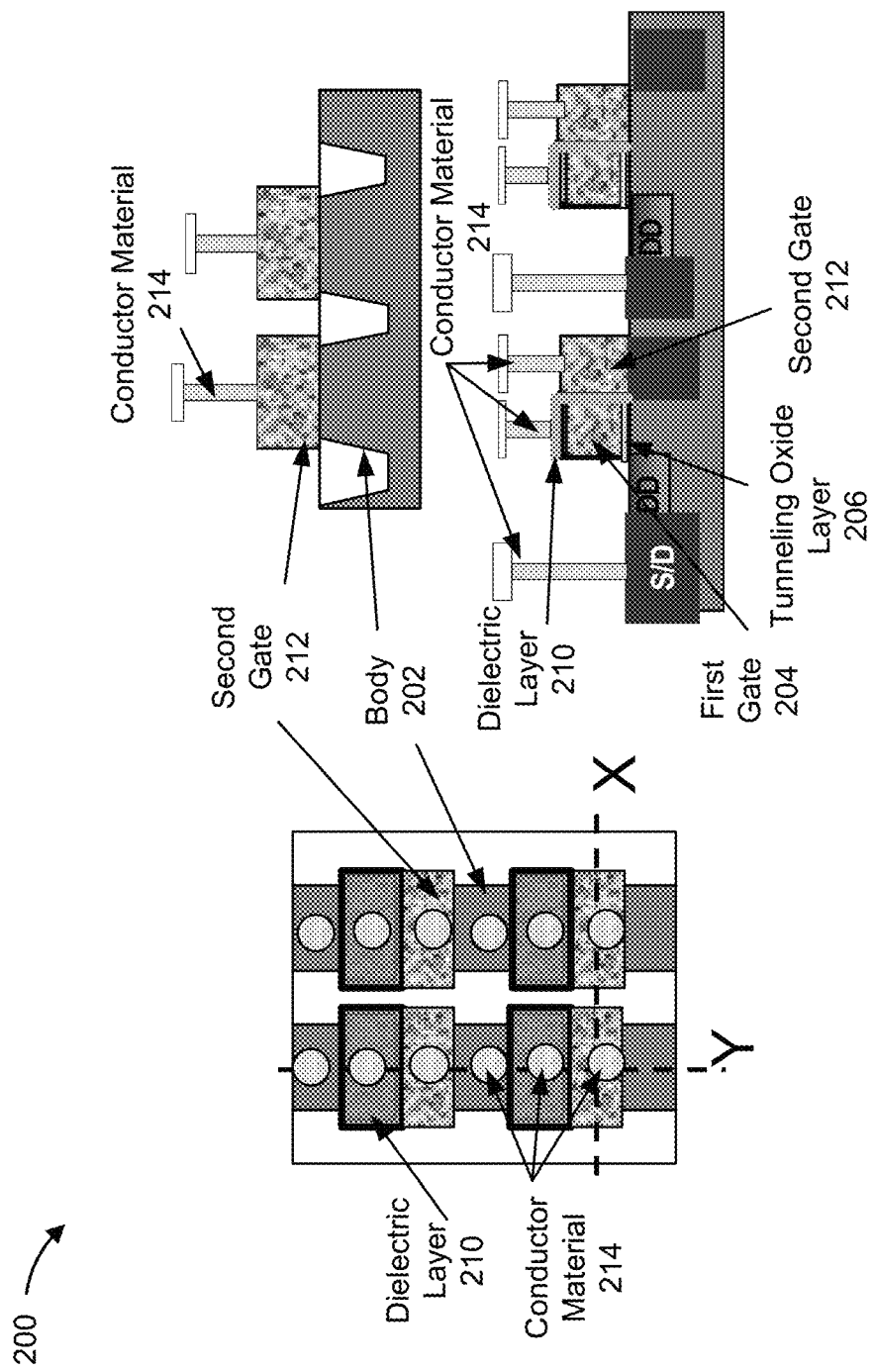

As shown in FIG. 2E, a deposition tool (e.g., deposition tool 102) may deposit a conductor material 214 on the first portion of the dielectric layer 210, on the second gate 212, and on a third portion of the body 202 of the semiconductor device 200. In some implementations, the deposition tool may use physical vapor deposition, among other examples, to deposit the conductor material 214 onto the first portion of the dielectric layer 210, on the second gate, and on a third portion of the body 202 of the semiconductor device 200. In some implementations, an etching tool (e.g., etching tool 104) may etch a portion of material for the conductor material 214 to form the conductor material 214.

In some implementations, the tunneling oxide layer 206, the first gate 204, the first portion of the dielectric layer 210, and a portion of the conductor material 214 deposited on the first portion of the dielectric layer 210 may form a first terminal of the semiconductor device 200. In some implementations, the second gate 212 and a portion of the conductor material 214 deposited on the on the second gate 212 may form a second terminal of the semiconductor device 200. In some implementations, a portion of the conductor material 214 deposited on the third portion of the body 202 of the semiconductor device 200 may form a third terminal of the semiconductor device 200.

Based on the second terminal including the second gate 212 that is separated from the first gate 204 by the second portion of the dielectric layer 210, the semiconductor device 200 may perform an erasing operation that is based on a voltage difference across the second portion of the dielectric layer 210 (e.g., instead of based on a voltage difference across the dielectric layer 210). This may reduce deterioration of the tunneling oxide layer 206 and extend a life of the semiconductor device 200.

The number and arrangement of structures and/or layers, among other examples, shown in FIGS. 2A-2E are provided as an example. In practice, a semiconductor device including additional structures and/or layers, fewer structures and/or layers, different structures and/or layers, or differently arranged structures and/or layers than those shown in FIGS. 2A-2E may be processed according to the techniques described above in connection with FIGS. 2A-2E.

Figure 3:
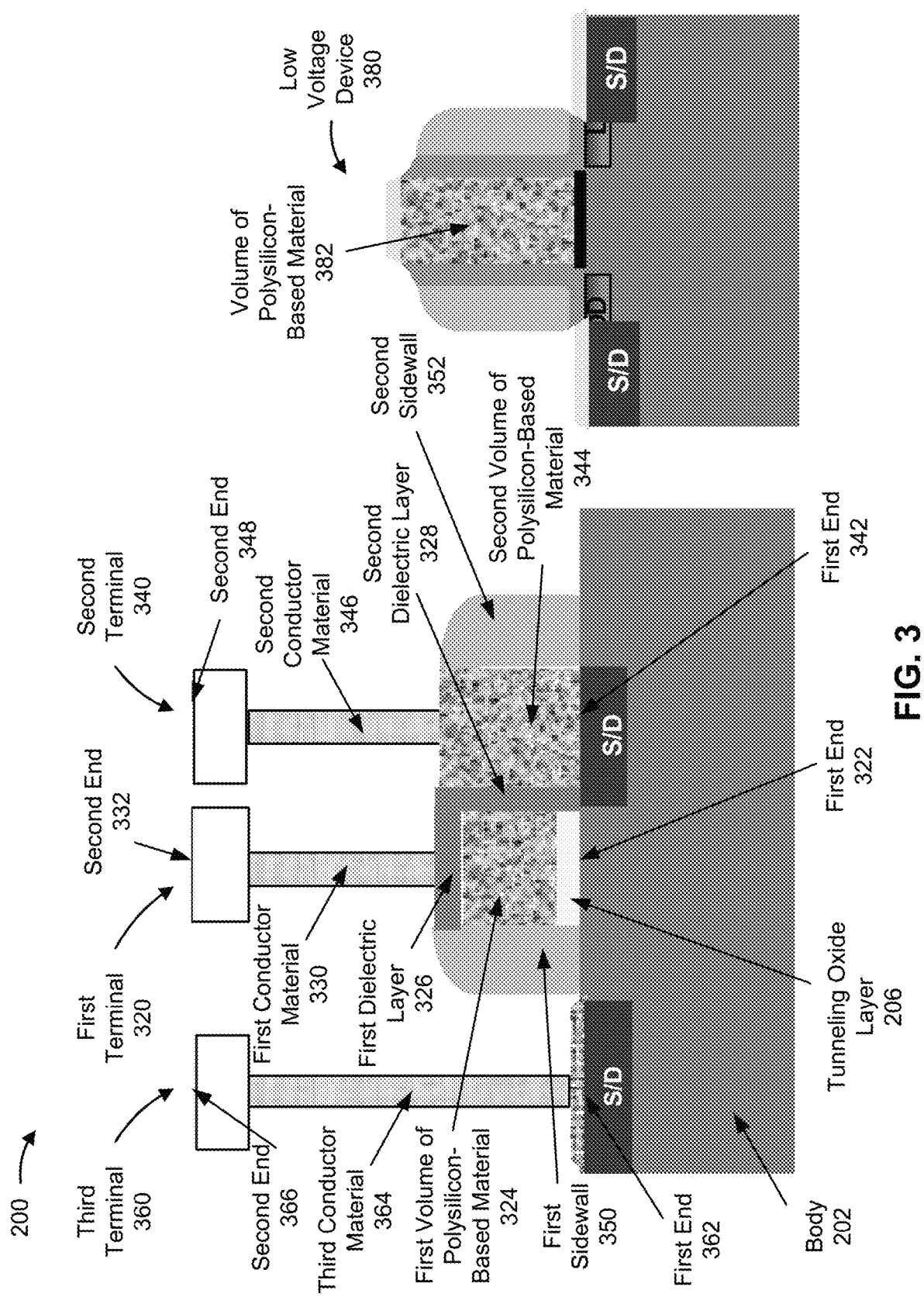
FIG. 3 is a diagram of an example semiconductor device formed based on the example techniques described in connection with FIGS. 2A-2E.

FIG. 3 is a diagram of a semiconductor device 200 formed based on the example techniques described in connection with FIGS. 2A-2E. In some implementations, the semiconductor device 200 may include a transistor.

As shown in FIG. 3, the semiconductor device 200 (e.g., a transistor) may include a first terminal 320 coupled to a body 202 of the semiconductor device 200. The first terminal 320 may include a tunneling oxide layer 206 at a first end 322 of the first terminal 320, a first volume of polysilicon-based material 324 (e.g., a first gate) disposed on the tunneling oxide layer 206, a first dielectric layer 326 disposed on an upper surface of the first volume of polysilicon-based material 324, a second dielectric layer 328 disposed on a side surface of the first volume of polysilicon-based material 324, and a first conductor material 330 at a second end 332. In some implementations, the first terminal 320 may be configured as a gate terminal for the semiconductor device 200. For example, the first terminal 320 may be configured as a floating gate terminal.

In some implementations, the first volume of polysilicon-based material 324 may have a thickness (e.g., a distance measured from a surface of the tunneling oxide layer 206) that is less than approximately 800 angstroms. In some implementations, the first volume of polysilicon-based material 324 may have a width (e.g., a distance measured along a surface of the tunneling oxide layer 206) that is less than approximately 95 angstroms.

In some implementations, the first dielectric layer 326 and/or the second dielectric layer 328 may include multiple sublayers. For example, the first dielectric layer 326 and/or the second dielectric layer 328 may include a first oxide-based layer, a silicon nitride-based layer, and a second oxide-based layer to form a sandwich structure as the first dielectric layer 326 and/or the second dielectric layer 328. In some implementations, the first dielectric layer 326 and/or the second dielectric layer 328 may have a thickness (e.g., a distance measured from a surface of the first volume of polysilicon-based material 324) that is less than approximately 160 angstroms and/or greater than approximately 100 angstroms.

The semiconductor device 200 may include a second terminal 340 coupled to the body 202 of the semiconductor device 200. The second terminal 340 may include a second volume of polysilicon-based material 344 (e.g., a second gate) at a first end 342 of the second terminal 340 and a second conductor material 346 at a second end 348. The second end 348 may be configured to receive a source voltage for the semiconductor device 200 (e.g., the body 202 of the semiconductor device 200) and/or to drain charge from the semiconductor device 200 (e.g., the body 202 of the semiconductor device 200). In other words, the second terminal 340 may be configured as a source and/or drain terminal for the semiconductor device 200. The second terminal 340 may be coupled to a source or drain of the body 202 of the semiconductor device 200 to be configured as a source and/or drain terminal for the semiconductor device 200. In some implementations, the second volume of polysilicon-based material 344 (e.g., the second gate) may be formed on a source and/or drain (e.g., a source/drain) of the body 202 of the transistor 200.

In some implementations, the second volume of polysilicon-based material 344 may have a thickness (e.g., a distance measured from a surface of the body 202 of the semiconductor device 200) that is less than approximately 920 angstroms. In some implementations, the second volume of polysilicon-based material 344 may have a width (e.g., a distance measured from a surface of the body 202 of the semiconductor device 200) that is less than approximately 95 angstroms.

In some implementations, the second dielectric layer 328 may be formed between the first volume of polysilicon-based material 324 and the second volume of polysilicon-based material 344. In some implementations, the second volume of polysilicon-based material 344 (e.g., the second gate) may have a first thickness that is greater than a second thickness of the first volume of polysilicon-based material 324 (e.g., the first gate).

In some implementations, the semiconductor device 200 may include a first sidewall 350 on a second side surface of the first volume of polysilicon-based material 324. In other words, the first sidewall 350 may be positioned on a side surface, of the first volume of polysilicon-based material 324, that is opposite the side surface (e.g., that is adjacent to the second dielectric layer 328) of the first volume of polysilicon-based material 324. In some implementations, the semiconductor device 200 may include a second sidewall 352 on a second side surface of the second volume of polysilicon-based material 344. In other words, the second sidewall 352 may be positioned on a side surface, of the second volume of polysilicon-based material 344, that is opposite the side surface (e.g., that is adjacent to the second dielectric layer 328) of the second volume of polysilicon-based material 344.

The semiconductor device 200 may include a third terminal 360 coupled to the body 202 of the semiconductor device 200. The third terminal 360 may include a third conductor material 364 that extends between a first end 362 of the third terminal 360 that is coupled to the body 202 of the semiconductor device 200, and a second end 366 of the third terminal 360. The second end 366 may be configured to receive a source voltage for the semiconductor device 200 (e.g., the body 202 of the semiconductor device 200) and/or to drain charge from the semiconductor device 200 (e.g., the body 202 of the semiconductor device 200). In other words, the third terminal 360 may be configured as a source and/or drain terminal for the semiconductor device 200.

In some implementations, the semiconductor device 200 may be configured to perform a programming operation based on application of a first voltage to the first terminal 320, with the first voltage being greater than a second voltage applied to the second terminal 340. For example, the first voltage may be approximately 8.7 volts and the second voltage may be approximately 4 volts, among other examples. In some implementations, the semiconductor device 200 may be configured to perform the programming operation based further on application of a third voltage to the third terminal 360, with the third voltage being less than the second voltage. For example, the third voltage may be approximately −2 microvolts or approximately 0 volts, among other examples.

In some implementations, the semiconductor device 200 may be configured to perform an erasing operation based on application of a first voltage to the first terminal 320, with the first voltage being less than a second voltage applied to the second terminal 340. For example, the first voltage may be approximately 0 volts and the second voltage may be approximately 10.5 volts, among other examples. In some implementations, the semiconductor device 200 may be configured to perform the erasing operation based further on application of a third voltage to the third terminal 360, with the third voltage being greater than or equal to the first voltage. For example, the third voltage may be approximately 0 volts, among other examples. In some implementations, application of the first voltage, to the first terminal 320, that is less than the second voltage applied to the second terminal 340 causes the erasing operation based on a voltage difference across the second dielectric layer 328 (e.g., instead of a voltage difference across the tunneling oxide layer 206).

In some implementations, the semiconductor device 200 may be manufactured in a same process as a low voltage device 380. In some implementations, the low voltage device 380 may include a volume of polysilicon-based material 382. In some implementations, a thickness (e.g., a height and/or a vertical distance with an orientation shown in FIG. 3) of the volume of polysilicon-based material 382 may be similar to a thickness of the first volume of polysilicon-based material 324 and/or a thickness of the second volume of polysilicon-based material 344. For example, the thickness of the volume of polysilicon-based material 382 may be less than double a thickness of the first volume of polysilicon-based material 324 and/or a thickness of the second volume of polysilicon-based material 344. In other examples, the thickness of the volume of polysilicon-based material 382 may be less than 50% and/or less than 20% greater than a thickness of the first volume of polysilicon-based material 324 and/or a thickness of the second volume of polysilicon-based material 344. In this way, a process for manufacturing the semiconductor device 200 and the low voltage device 380 may be simplified, have improved accuracy, and/or have reduced time relative to other processes.

As indicated above, FIG. 3 is provided as an example. Other examples may differ from what is described with regard to FIG. 3.

Figure 4:
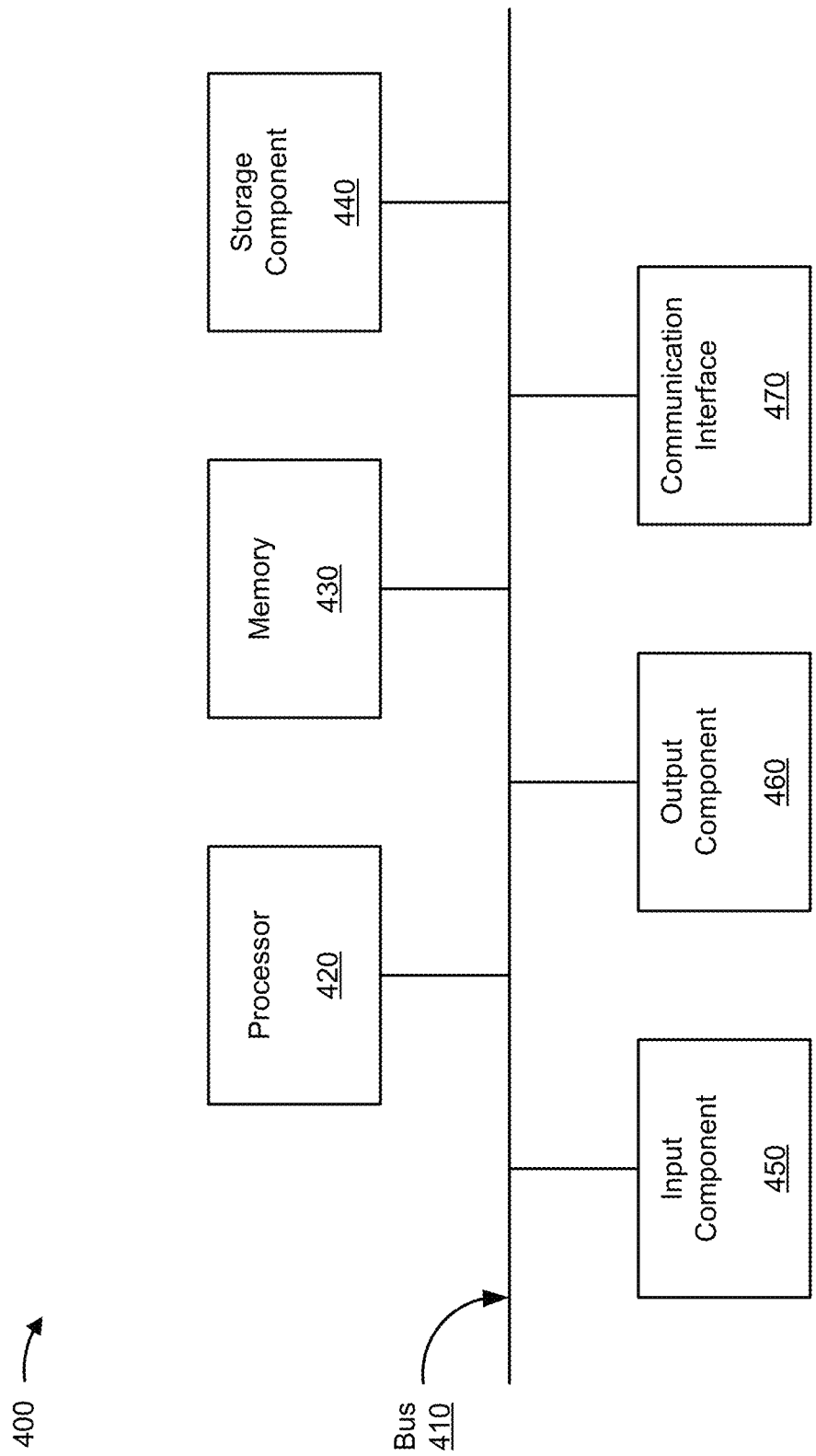
FIG. 4 is a diagram of example components of one or more devices of FIG. 1.

FIG. 4 is a diagram of example components of a device 400. In some implementations, deposition tool 102, etching tool 104, CMP tool 106, and/or wafer/die transport device 108 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, and/or an actuator, among other examples. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, and/or an antenna, among other examples.

Device 400 may perform one or more processes described herein. For example, a non-transitory computer-readable medium (e.g., memory 430 and/or storage component 440) may store a set of instructions (e.g., one or more instructions, code, software code, and/or program code, among other examples) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
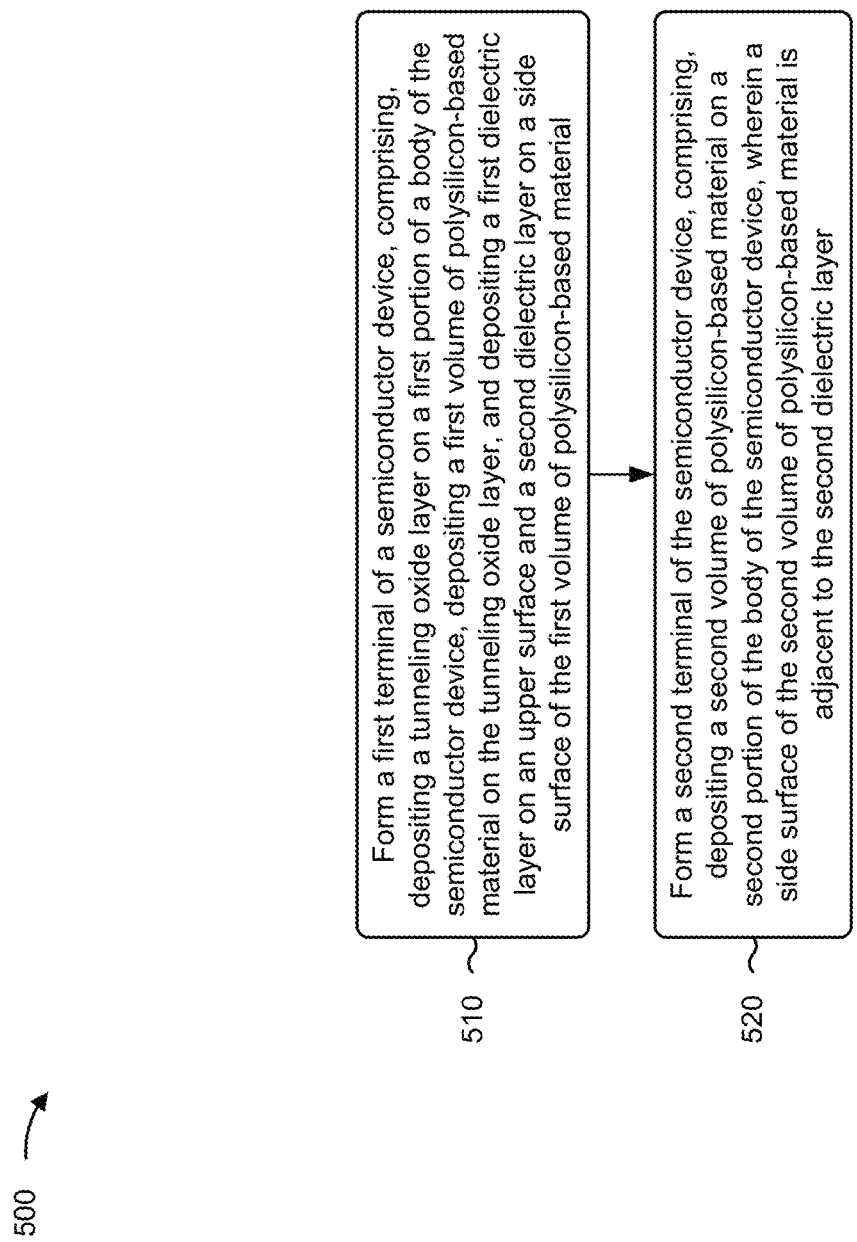
FIG. 5 is a flowchart of an example process of manufacturing a semiconductor device, as described herein.

FIG. 5 is a flowchart of an example process of manufacturing a semiconductor device. In some implementations, one or more process blocks of FIG. 5 may be performed by one or more semiconductor processing tools (e.g., one or more of deposition tool 102, etching tool 104, CMP tool 106, and/or wafer/die transport device 108). Additionally, or alternatively, one or more process blocks of FIG. 5 may be performed by one or more components of device 400, such as processor 420, memory 430, storage component 440, input component 450, output component 460, and/or communication component 470.

As shown in FIG. 5, process 500 may include forming a first terminal of a semiconductor device, comprising: depositing a tunneling oxide layer on a first portion of a body of the semiconductor device, depositing a first volume of polysilicon-based material on the tunneling oxide layer, and depositing a first dielectric layer on an upper surface and a second dielectric layer on a side surface of the first volume of polysilicon-based material (block 510). For example, the one or more semiconductor processing tools may form a first terminal 320 of a semiconductor device 200, by depositing a tunneling oxide layer 206 on a first portion of a body 202 of the semiconductor device 200, depositing a first volume of polysilicon-based material 324 on the tunneling oxide layer 206, and depositing a first dielectric layer 326 on an upper surface and a second dielectric layer 328 on a side surface of the first volume of polysilicon-based material 324, as described above.

As further shown in FIG. 5, process 500 may include forming a second terminal of the semiconductor device, comprising: depositing a second volume of polysilicon-based material on a second portion of the body of the semiconductor device, wherein a side surface of the second volume of polysilicon-based material is adjacent to the second dielectric layer (block 520). For example, the one or more semiconductor processing tools may form a second terminal 332 of the semiconductor device 200 by depositing a second volume of polysilicon-based material 344 on a second portion of the body 202 of the semiconductor device 200, wherein a side surface of the second volume of polysilicon-based material 344 is adjacent to the second dielectric layer 328, as described above.

Process 500 may include additional implementations, such as any single implementation or any combination of implementations described below and/or in connection with one or more other processes described elsewhere herein.

In a first implementation, process 500 includes forming a third terminal on a third portion of the body of the semiconductor device.

In a second implementation, alone or in combination with the first implementation, depositing the first dielectric layer and the second dielectric layer comprises depositing dielectric material on the semiconductor device after depositing the first volume of polysilicon-based material, and etching a portion of the dielectric material to form the first dielectric layer on the upper surface and the second dielectric layer on the side surface of the first volume of polysilicon-based material.

In a third implementation, alone or in combination with one or more of the first and second implementations, depositing the first dielectric layer and the second dielectric layer comprises depositing a first oxide-based film on the upper surface and the side surface of the first volume of polysilicon-based material, depositing a silicon nitride-based film on the first oxide-based film, and depositing a second oxide-based film on the silicon nitride-based film.

In a fourth implementation, alone or in combination with one or more of the first through third implementations, process 500 includes depositing a first sidewall on an additional side surface of the first volume of polysilicon-based material that is opposite the side surface of the first volume of polysilicon-based material, and depositing a second sidewall on an additional side surface of the second volume of polysilicon-based material that is opposite the side surface of the second volume of polysilicon-based material.

In a fifth implementation, alone or in combination with one or more of the first through fourth implementations, depositing the first volume of polysilicon-based material on the tunneling oxide layer comprises depositing a layer of polysilicon-based material on the upper surface of the tunneling oxide layer and on the body of the semiconductor device, and etching the layer of polysilicon-based material from the body of the semiconductor device to form the first volume of polysilicon-based material on the upper surface of the tunneling oxide layer.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Based on forming a second terminal 340 including a second gate 212 (e.g., a control gate) that is separated from a first gate 204 (e.g., a floating gate), included in a first terminal 320, by a dielectric layer 328, a semiconductor device 200 (e.g., a transistor) may perform an erasing operation that is based on a voltage difference across the dielectric layer 328 (e.g., instead of based on a voltage difference across the dielectric layer 210). This may reduce deterioration of the tunneling oxide layer 206 and extend a life of the semiconductor device 200.

As described greater detail above, some implementations described herein provide a semiconductor device, and one or more methods for forming the semiconductor device, having a first terminal that includes a first gate and a second terminal that includes a second gate, with a dielectric layer formed between the first gate and the second gate.

In some implementations, a semiconductor device may include a first terminal coupled to a body of the semiconductor device. The first terminal may include a tunneling oxide layer formed on the body of the semiconductor device, a first volume of polysilicon-based material formed on the tunneling oxide layer, and a first dielectric layer formed on the first volume of polysilicon-based material. The semiconductor device may also include a second terminal coupled to the body of the semiconductor device. The second terminal may include a second volume of polysilicon-based material formed on the body of the semiconductor device. The semiconductor device may further include a second dielectric layer formed between the first volume of polysilicon-based material and the second volume of polysilicon-based material.

In some implementations, a method of forming a semiconductor device may include forming a first terminal of a semiconductor device. Forming the first terminal may include depositing a tunneling oxide layer on a first portion of a body of the semiconductor device, depositing a first volume of polysilicon-based material on the tunneling oxide layer, and depositing a first dielectric layer on an upper surface and a second dielectric layer on a side surface of the first volume of polysilicon-based material. The method may also include forming a second terminal of the semiconductor device. Forming the second terminal may include depositing a second volume of polysilicon-based material on a second portion of the body of the semiconductor device. A side surface of the second volume of polysilicon-based material may be adjacent to the second dielectric layer.

In some implementations, a transistor may include a first terminal coupled to a body of the transistor. The first terminal may include a tunneling oxide layer formed on the body of the transistor, a first gate formed on the tunneling oxide layer, and a first dielectric layer formed on the first gate. The transistor may also include a second terminal coupled to the body of the transistor. The second terminal may include a second gate formed on the body of the transistor. The transistor may further include a second dielectric layer formed between the first gate from the second gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
   a body;
   a first terminal, coupled to the body, comprising:
      a tunneling oxide layer,
      a first gate, and
      a first dielectric layer;
   a second terminal, coupled to the body, comprising:
      a second gate formed directly on the body; and
   a second dielectric layer formed between the first gate and the second gate.
2. The semiconductor device of claim 1, wherein the first gate has at least one of:
   a thickness that is less than 800 angstroms, or
   a width that is less than 95 angstroms.
3. The semiconductor device of claim 1, wherein the second gate is formed directly on a source or drain of the body.
4. The semiconductor device of claim 1, further comprising:
   a first sidewall on a side surface of the first gate; and
   a second sidewall on a side surface of the second gate.
5. The semiconductor device of claim 1, further comprising:
   a third terminal configured to receive a source voltage or a drain charge from the body.
6. The semiconductor device of claim 5, wherein the semiconductor device is configured to perform a programming operation based on application of a voltage to the third terminal.
7. The semiconductor device of claim 5, wherein the semiconductor device is configured to perform an erasing operation based on application of a voltage to the third terminal.
8. A method, comprising:
   forming a first terminal of a semiconductor device, comprising:
      forming a tunneling oxide layer on a body of the semiconductor device,
      forming a first gate on the tunneling oxide layer, and
      forming dielectric layer on an upper surface and a side surface of the first gate; and forming a second terminal of the semiconductor device, comprising:
  forming a second gate directly on the body of the semiconductor device.

9. The method of claim 8, wherein forming the tunneling oxide layer comprises:
  depositing oxide material on the body; and
  etching a portion of the oxide material to form the tunneling oxide layer.

10. The method of claim 8, wherein forming the first gate comprises:
  depositing polysilicon-based material onto the tunneling oxide layer; and
  etching a portion of the polysilicon-based material to form the first gate.

11. The method of claim 8, wherein forming the dielectric layer on the upper surface and the side surface of the first gate comprises:
  depositing dielectric material on the first gate and the body; and
  etching a portion of the dielectric material to form the dielectric layer.

12. The method of claim 8, wherein forming the second gate comprises:
  depositing polysilicon-based material onto the body; and
  etching a portion of the polysilicon-based material to form the second gate.

13. The method of claim 8, wherein forming the second gate further comprises:
  planarizing an upper surface of the second gate.

14. The method of claim 8, wherein forming the second terminal further comprises:
  depositing conductor material on the second gate.

15. A transistor comprising:
  a body;
  a first terminal, coupled to the body, comprising:
    a tunneling oxide layer, and
    a first gate;
  a second terminal, coupled to the body, comprising:
    a second gate formed directly on a source or drain of the body; and
    a dielectric layer formed between the first gate and the second gate.

16. The transistor of claim 15, wherein the dielectric layer comprises one or more of:
  one or more oxide-based layers, or
  a silicon-nitride based layer.

17. The transistor of claim 15, wherein the dielectric layer has a thickness that is less than 160 angstroms.

18. The transistor of claim 17, wherein the thickness of the dielectric layer is greater than 100 angstroms.

19. The transistor of claim 15, wherein the second gate has a thickness that is less than 920 angstroms.

20. The transistor of claim 15, further comprising:
  a third terminal configured as a source or drain terminal.

* * * * *